US006906156B2

(12) United States Patent
Mahoney et al.

(10) Patent No.: US 6,906,156 B2
(45) Date of Patent: Jun. 14, 2005

(54) ACCELERATORS FOR CATIONIC POLYMERIZATION CATALYZED BY IRON-BASED CATALYST

(75) Inventors: Wayne S. Mahoney, Saint Paul, MN (US); Michael C. Palazzotto, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/653,669

(22) Filed: Sep. 2, 2003

(65) Prior Publication Data

US 2004/0048943 A1 Mar. 11, 2004

Related U.S. Application Data

(62) Division of application No. 09/603,548, filed on Jun. 26, 2000, now Pat. No. 6,635,689.

(51) Int. Cl.$^7$ .............................. C08F 4/72; C08F 4/80; C08G 59/68; C08G 65/00
(52) U.S. Cl. ...................... 526/170; 526/171; 526/332; 528/403; 528/405; 528/410; 528/412; 528/421; 522/29; 522/30; 522/66; 522/68; 522/170; 522/181
(58) Field of Search .............................. 522/29, 30, 66, 522/68, 170, 181; 526/170, 171, 332; 528/403, 405, 410, 412, 421

(56) References Cited

U.S. PATENT DOCUMENTS

| | | | |
|---|---|---|---|
| 3,907,706 A | 9/1975 | Robins | 252/431 |
| 4,297,458 A | 10/1981 | Stark, Jr. | 525/507 |
| 4,442,197 A | 4/1984 | Crivello et al. | |
| 4,503,211 A | 3/1985 | Robins | 528/92 |
| 4,518,676 A | 5/1985 | Irving | |
| 4,677,137 A | 6/1987 | Bany et al. | 522/31 |
| 4,788,235 A | 11/1988 | Johnson | 523/451 |
| 4,868,288 A | 9/1989 | Meier | 534/15 |
| 4,916,019 A | 4/1990 | Nakatani et al. | |
| 5,047,376 A * | 9/1991 | Baumann et al. | 502/5 |
| 5,059,701 A | 10/1991 | Keipert | 556/13 |
| 5,073,476 A | 12/1991 | Meier et al. | 430/280 |
| 5,089,536 A | 2/1992 | Palazzotto | 522/16 |
| 5,130,406 A * | 7/1992 | Muller et al. | 528/92 |
| 5,191,101 A * | 3/1993 | Palazzotto et al. | 556/47 |
| 5,212,210 A * | 5/1993 | Halm | 522/24 |
| 5,252,694 A | 10/1993 | Willett et al. | 525/404 |
| 5,310,840 A * | 5/1994 | Willett et al. | 526/273 |
| 5,362,421 A * | 11/1994 | Kropp et al. | 252/512 |
| 5,371,115 A | 12/1994 | Meier et al. | 522/13 |
| 5,385,954 A | 1/1995 | Palazzotto et al. | |
| 5,494,943 A * | 2/1996 | Mahoney et al. | 522/66 |
| 5,494,944 A | 2/1996 | Meier et al. | 522/18 |
| 5,521,227 A * | 5/1996 | Palazzotto et al. | 522/4 |
| 5,554,664 A | 9/1996 | Lamanna et al. | 522/25 |
| 5,672,637 A | 9/1997 | Mahoney et al. | 522/25 |
| 5,744,557 A | 4/1998 | McCormick et al. | |
| 6,133,335 A * | 10/2000 | Mahoney et al. | 522/29 |
| 6,265,459 B1 * | 7/2001 | Mahoney et al. | 522/17 |
| 6,291,059 B1 * | 9/2001 | Mahoney et al. | 428/317.3 |
| 6,482,868 B1 | 11/2002 | Mahoney et al. | 522/17 |
| 6,590,011 B1 * | 7/2003 | Rappoport et al. | 522/170 |

FOREIGN PATENT DOCUMENTS

| | | |
|---|---|---|
| EP | 094914 | 5/1983 |
| EP | 094915 | 5/1983 |
| EP | 126712 | 5/1984 |
| EP | 0 152 377 | 2/1985 |
| EP | 0 340 591 | 4/1989 |
| EP | 661324 | 11/1994 |
| EP | 0 764 690 | 6/1996 |
| EP | 0 688 804 A3 * | 7/1996 |
| JP | 60-110704 | 6/1985 |
| JP | 61-36302 | 2/1986 |
| JP | 05-202132 | 8/1993 |
| JP | 09 325479 A | 12/1997 |
| WO | 93 15124 | 8/1993 |
| WO | WO 96 13538 | 5/1996 |
| WO | 96 21704 | 7/1996 |
| WO | 96 32453 | 10/1996 |
| WO | WO 00/40635 | 7/2000 |
| WO | WO 00/40636 | 7/2000 |

OTHER PUBLICATIONS

Markowitz, M., "Controllable reactivity epoxy resin hardeners", Chemical Abstracts, vol. 88, No. 22, May 29, 1978, Columbus Ohio, abstract no. 153433.

McAdams et al, "Expoxy Resins", Encyclopedia of Polymer Science and Engineering, vol. 6, 1986, p. 322–382.

Wrighton et al, "Preparation of Chemically Derivatized Platinum and Gold Electrode Surfaces, Synthesis, Characterization, and Surface Attachment of Trichlorosilylferrocene", Journal of the American Chemical Society, vol. 100, No. 23 Nov. 8, 1978, p. 7264–7271.

Hendrickson, D. N., Sohn, TY. S., Gray, H. B., "Magnetic Susceptibility Study of Various Ferricenium and Iron (III) Dicarbollide Compounds", Inorganic Chemistry, vol. 10, No. 8, Aug. 1971, p. 1559–1563.

F. A. Cotton, G. Wilkinson, Periodic Table of Elements, BAsic Inorganic Chemistry, John Wiley & Sons, Inc., 1976, p. 497–527.

C. R. Noller, Chemistry of Organic Compounds, 3$^{rd}$ Edition, 1966, p. 602.

* cited by examiner

Primary Examiner—Susan Berman
(74) Attorney, Agent, or Firm—Jean A. Lown

(57) ABSTRACT

Accelerators that can be useful for an energy polymerizable composition comprising a cationically curable material; energy polymerizable compositions comprising at least one cationically curable material and an initiation system therefor, the initiation system comprising at least one organometallic complex salt and at least one accelerator; and a method for curing the compositions. The cured compositions can provide useful articles. The invention also provides compositions of matter comprising an organometallic complex salt and at least one compound selected from the Class 1 through Class 4 compounds disclosed herein.

23 Claims, No Drawings

ACCELERATORS FOR CATIONIC POLYMERIZATION CATALYZED BY IRON-BASED CATALYST

CROSS REFERENCE TO RELATED APPLICATIONS

This application is a division of U.S. patent application Ser. No. 09/603,548, filed Jun. 26, 2000 now U.S. Pat. No. 6,635,689.

FIELD OF INVENTION

This invention relates to accelerators that may be useful for energy polymerizable compositions comprising a cationically curable material; energy-polymerizable compositions that comprise a cationically curable material and a two-component initiator system, which initiator system comprises at least one organometallic complex salt and at least one accelerator; and a method for curing the compositions. This invention also relates to preparing articles comprising the cured compositions. In addition to other uses, the compositions are useful as molded articles, as coating compositions including abrasion resistant coatings, as adhesives including structural adhesives, and as binders for abrasives and magnetic media. The invention also relates to compositions of matter comprising an organometallic complex salt and at least one compound selected from the Class 1 through Class 4 compounds disclosed herein.

BACKGROUND

Transition metal salts comprising an organometallic cation and a non-nucleophilic counteranion have been shown to have utility as photochemically activated initiators for cationic addition polymerization. These photoinitiator salts include (cyclopentadienyl) (arene) iron$^+$ salts of the anions $PF_6^-$ and $SbF_6^-$. Similarly, certain classes of these salts are known to be thermally-activatable curatives for cationic polymerizations.

For many commercial applications, the monomers being polymerized are often multifunctional (i.e., contain more than one polymerizable group per molecule), for example, epoxides, such as diglycidyl ethers of bisphenol A (DGEBA). Mixtures of multifunctional monomers such as epoxides and polyalcohols (polyols) or polyepoxides and polyalcohols can undergo acid-catalyzed polycondensation via a step-growth mechanism. Also included in this description are multireactive monomers—those that comprise two or more classes of reactive groups.

In many applications photoinduced polymerization is impossible, impractical or undesirable. For example, many situations where polymerization reactions occur in a closed environment (i.e., in a mold or in a laminated product) or where polymerizable compositions may contain opacifying pigments, thermally activated initiators are preferred. Thermally-activated initiators, such as known organometallic salts, may be used to initiate polymerization in these cases.

There is a continuing need to be able to modify the rate and temperature of polymerization of energy polymerizable compositions to meet the needs of specific applications.

SUMMARY OF THE INVENTION

The present invention relates to accelerators that may be used to influence the temperature at which the polymerization of an energy polymerizable composition comprising a cationically curable material occurs. In particular, the accelerators of this invention may be used to reduce the polymerization temperature or allow modification of the rate or degree of polymerization at a given temperature of cationically-polymerizable materials when organometallic salt initiators are used in cationic polymerization.

Briefly, in one aspect, this invention provides a method comprising the step of using at least one accelerator and at least one salt of an organometallic complex cation to increase the rate, or reduce the temperature, of cure of an energy polymerizable composition comprising a cationically curable material, wherein said cation contains at least one carbon atom bonded to a transition metal atom, and wherein said accelerator, or an active portion thereof, comprises at least one compound selected from classes 1 through 4 class 1 comprises compounds represented by Formula III, class 2 comprises compounds represented by Formula IV, class 3 comprises compounds represented by Formula V, and class 4 comprises compounds represented by Formula VI.

In another aspect this invention provides an energy polymerizable composition comprising:

(a) at least one cationically curable material;

(b) a two-component initiator system comprising:

(1) at least one salt of an organometallic complex cation, wherein said cation contains at least one carbon atom bonded to a transition metal atom, and (2) at least one accelerator, or an active portion thereof, of classes 1, 2, 3, and 4 wherein class 1 comprises compounds represented by Formula III, class 2 comprises compounds represented by Formula IV, class 3 comprises compounds represented by Formula V, and class 4 comprises compounds represented by Formula VI herein.

In other aspects, the invention provides an energy polymerizable composition with one or more of the following optional components:

(a) at least one of an alcohol-containing material and additional adjuvants;

(b) stabilizing ligands to improve shelf-life;

(c) at least one film-forming thermoplastic oligomeric or polymeric resin essentially free of nucleophilic groups, such as amine, amide, nitrile, sulfur, or phosphorous functional groups or metal-complexing groups, such as carboxylic acid and sulfonic acid; and (d) coupling agents to modify adhesion.

In another aspect, the invention provides a process for controlling or modifying the cure of a composition comprising the steps of:

(a) providing the energy polymerizable composition of the invention, (b) adding sufficient energy to the composition in the form of at least one of heat, radiation, and light, in any combination and order, to polymerize the composition.

In another aspect, this invention provides an article comprising a substrate having on at least one surface thereof a layer of the composition of the invention. The article can be provided by a method comprising the steps:

(a) providing a substrate, (b) coating the substrate with the curable composition of the invention and, optionally, adjuvants; and (c) supplying sufficient energy to the composition in the form of at least one of heat, radiation, and light in any combination and order to polymerize the composition.

In another aspect, this invention provides a composition of matter comprising
(1) at least one salt of an organometallic complex cation, wherein said cation contains at least one carbon atom bonded to a transition metal atom, and
(2) at least one compound, or an active portion thereof, from classes 1, 2, 3, and 4 wherein class 1 comprises compounds represented by Formula III, class 2 comprises compounds represented by Formula IV, class 3 comprises compounds represented by Formula V, and class 4 comprises compounds represented by Formula VI herein.

As used in this application:

"energy-induced curing" means curing or polymerization by means of heat or light(e.g., ultraviolet and visible), radiation (e.g., electron beam), or light in combination with heat means, typically such that heat and light are used simultaneously, or in any sequence, for example, heat followed by light, light followed by heat followed by light;

"catalytically-effective amount" means a quantity sufficient to effect polymerization of the curable composition to a polymerized product at least to a degree to cause an increase in viscosity of the composition under the conditions specified;

"organometallic salt" means an ionic salt of an organometallic complex cation, wherein the cation contains at least one carbon atom of an organic group that is bonded to a metal atom of the transition metal series of the Periodic Table of Elements ("Basic Inorganic Chemistry", F. A. Cotton, G. Wilkinson, Wiley, 1976, p. 497);

"initiator" and "catalyst" are used interchangeably and mean at least one salt of an organometallic complex cation that can change the speed of a chemical reaction;

"cationically curable monomer" means at least one epoxide containing or vinyl ether containing material;

"polymerizable composition" or "curable composition" as used herein means a mixture of the initiator system and the cationically curable monomer; alcohols and adjuvants optionally can be present;

"polymerize" or "cure" means to supply sufficient energy to a composition in the form of at least one of heat, radiation, and light in any order or combination to alter the physical state of the composition, to make it transform from a fluid to less fluid state, to go from a tacky to a non-tacky state, to go from a soluble to insoluble state, or to decrease the amount of polymerizable material by its consumption in a chemical reaction;

"initiation system", "initiator system", or "two-component initiator" means at least one salt of an organometallic complex cation and at least one accelerator, the system being capable of initiating polymerization;

"accelerator", "accelerating additive" means at least one of member of a specified class of compounds that moderate the cure of a composition of the invention by reducing the polymerization temperature or allowing an increase of the rate or degree of polymerization at a given temperature;

"epoxy-containing" means a material comprising at least one epoxy and may further comprise accelerating additives, stabilizing additives, fillers, diols, and other additives;

"group" or "compound" or "ligand" means a chemical species that allows for substitution or which may be substituted by conventional substituents which do not interfere with the desired product, e.g., substituents can be alkyl, alkoxy, aryl, phenyl, halo (F, Cl, Br, I), cyano, nitro, etc., and "epoxy/polyol" and "catalyst/additive", etc., mean combinations of the substances on both sides of the slash ("/").

An advantage of at least one embodiment of the present invention is that the initiator system can initiate curing of a thermally- or photo-polymerizable composition at temperatures lower than temperatures required for reactions initiated without the accelerators of the present invention.

Another advantage of at least one embodiment of the invention is that the initiator system can provide enhanced curing of a thermally- or photo-polymerizable composition at a given temperature. For example, at a given temperature, curing time can be reduced as compared to curing times for reactions initiated without the accelerators of the invention.

DETAILED DISCLOSURE

The present invention provides an energy polymerizable composition comprising at least one cationically-polymerizable material and an initiation system therefor, the initiation system comprising at least one organometallic complex salt and at least one accelerator. The cured composition provides useful articles or coated articles.

Epoxy compounds that can be cured or polymerized by the processes of this invention are those known to undergo cationic polymerization and include 1,2-, 1,3-, and 1,4-cyclic ethers (also designated as 1,2-, 1,3-, and 1,4-epoxides).

See the "Encyclopedia of Polymer Science and Technology", 6, (1986), p. 322, for a description of suitable epoxy resins. In particular, cyclic ethers that are useful include the cycloaliphatic epoxies such as cyclohexene oxide and the ERL series type of resins available from Union Carbide, New York, N.Y., such as vinylcyclohexene oxide, vinylcyclohexene dioxide, 3,4-epoxycyclohexylmethyl-3,4-epoxycyclohexane carboxylate, bis-(3,4-epoxycyclohexyl) adipate and 2-(3,4-epoxycylclohexyl-5,5-spiro-3,4-epoxy) cyclohexene-meta-dioxane; also included are the glycidyl ether type epoxy resins such as propylene oxide, epichlorohydrin, styrene oxide, glycidol, the EPON series type of epoxy resins available from Shell Chemical Co., Houston, Tex., including the diglycidyl either of bisphenol A and chain extended versions of this material such as EPON 828, EPON 1001, EPON 1004, EPON 1007, EPON 1009 and EPON 2002 or their equivalent from other manufacturers, dicyclopentadiene dioxide, epoxidized vegetable oils such as epoxidized linseed and soybean oils available as VIKOLOX and VIKOFLEX resins from Elf Atochem North America, Inc., Philadelphia, Pa., epoxidized KRATON LIQUID Polymers, such as L-207 available from Shell Chemical Co., Houston, Tex., epoxidized polybutadienes such as the POLY BD resins from Elf Atochem, Philadelphia, Pa., 1,4-butanediol diglycidyl ether, polyglycidyl ether of phenolformaldehyde, epoxidized phenolic novolac resins such as DEN 431 and DEN 438 available from Dow Chemical Co., Midland Mich., epoxidized cresol novolac resins such as ARALDITE ECN 1299 available from Ciba, Hawthorn, N.Y., resorcinol diglycidyl ether, and epoxidized polystyrene/polybutadiene blends such as the EPOFRIEND resins such as EPOFRIEND A1010 available from Daicel USA Inc., Fort Lee, N.J., and resorcinol diglycidyl ether.

The preferred epoxy resins include the ERL type of resins especially 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane and the bisphenol A EPON type resins including 2,2-bis-[p-(2,3-epoxypropoxy) phenylpropane and chain extended versions of this material. It is also within the scope of this invention to use a blend of more than one epoxy resin. The different kinds of resins can be present in any proportion.

It is within the scope of this invention to use vinyl ether monomers as the cationically curable material. Vinyl ether-containing monomers can be methyl vinyl ether, ethyl vinyl ether, tert-butyl vinyl ether, isobutyl vinyl ether, triethyleneglycol divinyl ether (RAPI-CURE DVE-3, available from International Specialty Products, Wayne, N.J.), 1,4-cyclohexanedimethanol divinyl ether (RAPI-CURE CHVE, International Specialty Products), trimetylolpropane trivinyl ether (TMPTVE, available from BASF Corp., Mount Olive, N.J.) and the VECTOMER divinyl ether resins from Allied Signal, such as VECTOMER 2010, VECTOMER 2020, VECTOMER 4010, and VECTOMER 4020, or their equivalent from other manufacturers. It is within the scope of this invention to use a blend of more than one vinyl ether resin.

It is also within the scope of this invention to use one or more epoxy resins blended with one or more vinyl ether resins. The different kinds of resins can be present in any proportion.

Bifunctional monomers may also be used and examples that are useful in this invention possess at least one cationically polymerizable functionality or a functionality that copolymerizes with cationically polymerizable monomers, e.g., functionalities that will allow an epoxy-alcohol copolymerizaton.

When two or more polymerizable compositions are present, they can be present in any proportion.

Suitable salts of organometallic complex cations of the initiator system include, but are not limited to, those salts disclosed in U.S. Pat. No. 5,089,536, (col. 2, line 48, to col. 16, line 10), which patent is incorporated herein by reference in its entirety.

In preferred compositions of the invention, the organometallic complex salt of the initiator system is represented by the following formula:

$$[(L^1)_y(L^2)_zM]^{+q}X_n \qquad (I)$$

wherein

M is selected from the group comprising Cr, Ni, Mo, W, Mn, Tc, Re, Fe, Ru, Os, Co, Rh and Ir;

$L^1$ represents the same or different ligands contributing pi-electrons that can be selected from aromatic compounds and heterocyclic aromatic compounds, and the ligand is capable of contributing six pi-electrons to the valence shell of M;

$L^2$ represents the same or different ligands contributing pi-electrons that can be selected from cyclopentadienyl and indenyl anion groups, and the ligand is capable of contributing six pi-electrons to the valence shell of M;

q is an integer having a value of 1 or 2, the residual charge of the complex cation;

y and z are integers having a value of zero, one, or two, provided that the sum of y and z is equal to 2;

X is an anion selected from tris-(highly fluorinated alkyl) sulfonyl methide, bis-(highly fluorinated alkyl)sulfonyl imide, tris-(fluorinated aryl)sulfonyl methide, tetrakis-(fluorinated aryl) borate, organic sulfonate anions, and halogen-containing complex anions of a metal or metalloid; and n is an integer having a value of 1 or 2, the number of complex anions required to neutralize the charge q on the complex cation.

Ligands $L^1$ and $L^2$ are well known in the art of transition metal organometallic compounds.

Ligand $L^1$ is provided by any monomeric or polymeric compound having an accessible aromatic group regardless of the total molecular weight of the compound. By "accessible", it is meant that the compound (or precursor compound from which the accessible compound is prepared) bearing the unsaturated group is soluble in a reaction medium, such as an alcohol, e.g., methanol; a ketone, e.g., methyl ethyl ketone; an ester, e.g., amyl acetate; a halocarbon, e.g., trichloroethylene; an alkane, e.g., decalin; an aromatic hydrocarbon, e.g., anisole; an ether, e.g., tetrahydrofuran; or that the compound is divisible into very fine particles of high surface area so that the unsaturated group (that is, the aromatic group) is sufficiently close to the metal to form a pi-bond between that unsaturated group and M. By polymeric compound, is meant, as explained below, that the ligand can be a group on a polymeric chain.

Illustrative of ligand $L^1$ are substituted and unsubstituted carbocyclic and heterocyclic aromatic ligands having up to 25 rings and up to 100 carbon atoms and up to 10 heteroatoms selected from nitrogen, sulfur, non-peroxidic oxygen, phosphorus, arsenic, selenium, boron, antimony, tellurium, silicon, germanium, and tin, such as, for example, $eta^6$-benzene, $eta^6$-mesitylene, $eta^6$-toluene, $eta^6$-p-xylene, $eta^6$-o-xylene, $eta^6$-m-xylene, $eta^6$-cumene, $eta^6$-durene, $eta^6$-pentamethylbenzene, $eta^6$-hexamethylbenzene, $eta^6$-fluorene, $eta^6$-naphthalene, $eta^6$-anthracene, $eta^6$-perylene, $eta^6$-chrysene, $eta^6$-pyrene, $eta^6$-triphenylmethane, $eta^6$-paracyclophane, and $eta^6$-carbazole. Other suitable aromatic compounds can be found by consulting any of many chemical handbooks.

Illustrative of ligand $L^2$ are ligands derived from the substituted and unsubstituted $eta^5$-cyclopentadienyl anion, for example, $eta^5$-cyclopentadienyl anion, $eta^5$-methylcyclopentadienyl anion, $eta^5$-pentamethylcyclopentadienyl anion, $eta^5$-trimethylsilylcyclopentadienyl anion, $eta^5$-trimethyltincyclopentadienyl anion, $eta^5$-triphenyltincyclopentadienyl anion, $eta^5$-triphenylsilylcyclopentadienyl anion, and $eta^5$-indenyl anion.

Each of the ligands $L^1$ and $L^2$ can be substituted by groups that do not interfere with the complexing action of the ligand to the metal atom or that do not reduce the solubility of the ligand to the extent that competing with the metal atom does not take place. Examples of substituting groups, all of which preferably have less than 30 carbon atoms and up to 10 hetero atoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, phenyl, benzyl, allyl, benzylidene, ethenyl, and ethynyl; cyclohydrocarbyl such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, and cyclohexanecarbonyloxy; hydrocarbylcarbonamido, for example, acetamido, benzamido; azo; boryl; halo, for example, chloro, iodo, bromo, and fluoro; hydroxy; cyano; nitro; nitroso; oxo; dimethylamino; diphenylphosphino; diphenylarsino; diphenylstibine; trimethylgermane; tributyltin; methylseleno; ethyltelluro; and trimethylsiloxy.

Ligands $L^1$ and $L^2$ independently can be a unit of a polymer. $L^1$ for example, can be the phenyl group in polystyrene, or polymethylphenylsiloxane; or the carbazole group in polyvinylcarbazole. $L^2$, for example, can be the cyclopentadiene group in poly(vinylcyclopentadiene). Polymers having a weight average molecular weight up to 1,000,000 or more can be used. It is preferable that 5 to 50% of the aromatic groups present in the polymer be complexed with metallic cations.

In addition to those described above, suitable anions, X, in Formula I, for use as the counterion in the ionic salts of the organometallic complex cation in the coating compositions are those in which X can be represented by the formula $$DQ_r \tag{II}$$

wherein

D is a metal from Groups IB to VIIB and VIII or a metal or metalloid from Groups IIIA to VA of the Periodic Table of Elements (CAS notation), Q is a halogen atom, hydroxyl group, a substituted or unsubstituted phenyl group, or a substituted or unsubstituted alkyl group, and r is an integer having a value of 1 to 6.

Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen atom, Q, is chlorine or fluorine. Illustrative of suitable anions are $B(phenyl)_4^-$, $B(phenyl)_3(alkyl)^-$, where alkyl can be ethyl, propyl, butyl, hexyl and the like, $BF_4^-$, $PF_6^-$, $AsF_6^-$, $SbF_6^-$, $FeCl_4^-$, $SnCl_5^-$, $SbF_5OH^-$, $AlCl_4^-$, $AlF_6^-$, $GaCl_4^-$, $InF_4^-$, $TiF_6^-$, $ZrF_6^-$, $B(C_6F_5)_4^-$, $B(C_6F_3(CF_3)_2)_4^-$.

Additional suitable anions, X, in Formula I, of use as the counterion in the ionic salts of the organometallic complex cations include those in which X is an organic sulfonate. Illustrative of suitable sulfonate-containing anions are $CH_3SO_3^-$, $CF_3SO_3^-$, $C_6H_5SO_3^-$, p-toluenesulfonate, p-chlorobenzenesulfonate and related isomers. Additional suitable anions include tris-(highly fluorinated alkyl) sulfonyl methide, bis-(highly fluorinated alkyl)sulfonyl imide, tris-(fluorinated aryl)sulfonyl methide, as described in U.S. Pat. No. 5,554,664, which patent is incorporated herein by reference. Preferably, the anions are $BF_4^-$, $PF_6^-$, $SbF_6^-$, $SbF_5OH^-$, $AsF_6^-$, $SbCl_6^-$, $SbF_5OH^-$, $AsF_6^-$, $SbCl_6^-$, $CF_3SO_3$, $C(SO_2CF_3)_3^-$, and $N(SO_2CF_3)_2^-$.

Organometallic salts are known in the art and can be prepared as disclosed in, for example, EPO Nos. 094,914, 094,915, 126,712, and U.S. Pat. Nos. 5,089,536, 5,059,701, 5,191,101, which are incorporated herein by reference. Also, disubstituted ferrocene derivatives can be prepared by the general procedure described in *J. Amer. Chem. Soc.*, 1978, 100, 7264. Ferrocene derivatives can be oxidized to prepare the corresponding ferrocenium salts by the procedure described in *Inorg. Chem.*, 1971, 10, 1559.

The preferred salts of organometallic complex cations useful in the compositions of the invention are derived from Formula I where $L^1$ is chosen from the class of aromatic compounds, preferably based on benzene, and $L^2$ is chosen from the class of compounds containing a cyclopentadienyl anion group, M is Fe and X is selected from the group consisting of tetrafluoroborate, hexafluorophosphate, hexafluoroarsenate, hexafluoroantimonate, tris-(trifluoromethylsulfonyl) methide, bis(trifluoromethylsulfonyl)imide, hydroxypentafluoroantimonate or trifluoromethanesulfonate. The most preferred salts of the organometallic complex cations useful in the invention are included in Formula I where only $L^1$ is present, or where both $L^1$ and $L^2$ are present, M is Fe and X is selected from the group consisting of tetrafluoroborate, hexafluorophosphate, hexafluoroarsenate, hexafluoroantimonate, bis(trifluoromethylsulfonyl)imide, hydroxypentafluoroantimonate, trifluoromethanesulfonate, and tris-(trifluoromethylsulfonyl) methide. The organometallic complex cations can be used as mixtures and isomeric mixtures.

In the preferred compositions of the invention, salts of the organometallic complex cation include those disclosed in U.S. Pat. No. 5,089,536, which is incorporated herein by reference.

Examples of the preferred salts of organometallic complex cations useful in preparing the compositions of the invention include bis-($eta^6$-arene)iron complex cations, bis ($eta^5$-cyclopentadienyl)iron complex cations, and (eta-5-cyclopentadienyl)iron arene complex cations such as:

bis-($eta^6$-cumene)iron(2+) hexafluoroantimonate,
bis-($eta^6$-durene)iron(2+) hexafluoroantimonate,
bis-($eta^6$-mesitylene)iron(2+) trifluoromethanesulfonate,
bis-($eta^6$-mesitylene)iron(2+) hexafluoroantimonate,
bis-($eta^6$-mesitylene)iron(2+) tris-(trifluoromethylsulfonyl) methide,
bis-($eta^6$-hexamethylbenzene)iron(2+) hexafluoroantimonate,
bis-($eta^6$-pentamethylbenzene)iron(2+) hexafluoroantimonate,
bis-($eta^6$-naphthalene)iron(2+) hexafluoroantimonate,
bis-($eta^6$-pyrene)iron(2+) hexafluoroantimonate,
($eta^6$-naphthalene)($eta^5$-cyclopentadienyl)iron(1+) hexafluoroantimonate,
($eta^6$-pyrene)($eta^5$-cyclopentadienyl)iron(1+) hexafluoroantimonate,
bis-($eta^5$-pentamethylcyclopentadienyl)iron(1+) hexafluoroantimonate,
bis-($eta^5$-methylcyclopentadienyl)iron(1+) hexafluoroantimonate,
bis-($eta^5$-trimethylsilylcyclopentadienyl)iron(1+) hexafluoroantimonate,
bis-($eta^5$-indenyl)iron(1+) hexafluoroantimonate,
($eta^5$-cyclopentadienyl)($eta^5$-methylcyclopentadienyl)iron (1+) hexafluoroantimonate,
bis-($eta^5$-cyclopentadienyl)iron(1+) trifluoromethanesulfonate,
bis-($eta^5$-cyclopentadienyl)iron(1+) hexafluoroantimonate,
bis-($eta^5$-cyclopentadienyl)iron(1+) tris-(trifluoromethylsulfonyl)methide,
($eta^6$-xylenes(mixed isomers))($eta^5$-cyclopentadienyl)iron (1+) hexafluoroantimonate,
($eta^6$-xylenes(mixed isomers))(cylopentadienyl)iron ($eta^5$1+) hexafluophosphate,
($eta^6$-xylenes(mixed isomers))($eta^5$-cyclopentadienyl)iron (1+) tris-(trifluoromethylsulfonyl)methide,
($eta^6$-xylenes(mixed isomers))($eta^5$-cyclopentadienyl)iron (1+) bis-(trifluoromethylsulfonyl)imide,
($eta^6$-m-xylene)($eta^5$-cyclopentadienyl)iron(1+) tetrafluoroborate,
($eta^6$-o-xylene)($eta^5$-cyclopentadienyl)iron(1+) hexafluoroantimonate,
($eta^6$-p-xylenes)($eta^5$-cyclopentadienyl)iron(1+) trifluoromethanesulfonate,
($eta^6$-toluene)($eta^5$-cyclopentadienyl)iron(1+) hexafluoroantimonate,
($eta^6$-cumene)($eta^5$-cyclopentadienyl)iron(1+) hexafluoroantimonate,
($eta^6$-m-xylene)($eta^5$-cyclopentadienyl)iron(1+) hexafluoroantimonate,
($eta^6$-hexamethylbenzene)($eta^5$-cyclopentadienyl)iron(1+) hexafluoroantimonate,
($eta^6$-mesitylene)($eta^5$-cyclopentadienyl-)iron(1+) hexafluoroantimonate, (eta⁶-cumene)(eta⁵-cyclopentadienyl)iron(1+) hexafluorophosphate,
(eta⁶-cumene)(eta⁵-cyclopentadienyl)iron(1+) tris-(trifluoromethylsulfonyl)methide, and
(eta⁶-mesitylene)(eta⁵-cyclopentadienyl)iron(1+) pentafluorohydroxyantimonate.

In the polymerizable compositions of the present invention, the initiator salts can be present in a catalytically effective amount to initiate polymerization, generally in the range of 0.01 to 20 weight percent (wt %), preferably 0.1 to 10 wt %, of the curable composition; i.e., the total compositions excluding any solvent that may be present.

Accelerators of the present invention may be selected from four classes of materials. The active portions of these materials (see Formulae III to VI) can be part of a polymer or included as part of any component in the compositions of the invention.

Class 1 is described by the Formula III:

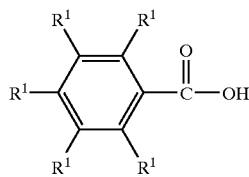

(III)

Molecules of Class 1 comprise aromatic carboxyl containing molecules wherein each $R^1$, independently, can be hydrogen or a group selected from chloro, iodo, bromo, fluoro, hydroxy, cyano, nitro, nitroso, carboxyl, formyl, acetyl, benzoyl, trialkylsilyl, and trialkoxysilyl. Additionally, each $R^1$, independently, can be a radical moiety selected from substituted and unsubstituted alkyl, alkenyl, alkynyl, and alkoxy groups containing up to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted. It is important that the substituting groups not interfere with the complexing action of the accelerating additive with the metal complex, or interfere with the cationic polymerization of the invention.

Examples of substituting groups that can be present in any $R^1$ group, or can be attached directly to the ring, all of which preferably have less than 30 carbon atoms and up to 10 hetero atoms wherein heteroatoms can interrupt carbon chains to form, for example, ether or thio linkages selected from sulfur or non-peroxidic oxygen, include hydrocarbyl groups such as methyl, ethyl, butyl, dodecyl, tetracosanyl, phenyl, benzyl, allyl, benzylidene, ethenyl, and ethynyl; cyclohydrocarbyl groups such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl, propoxycarbonyl, and phenoxycarbonyl; hydrocarbylcarbonyl such as formyl, acetyl, and benzoyl; hydrocarbylcarbonyloxy such as acetoxy, and cyclohexanecarbonyloxy; perfluorohydrocarbyl groups such as trifluoromethyl and pentafluorophenyl; azo; boryl; halo, for example, chloro, iodo, bromo, and fluoro; hydroxy; carboxyl; cyano; nitro; nitroso; trimethylsiloxy; and aromatic groups such as cyclopentadienyl, phenyl, naphthyl and indenyl. Additionally, the $R^1$s may be a unit of a polymer. Examples of suitable Class I accelerators include benzoic acid, salicylic acid, 2,3-dihydroxybenzoic acid, 2,3,4-trihydroxybenzoic acid, o-anisic acid, 2-ethoxybenzoic acid, o-toluic acid, m-toluic acid, p-toluic acid, haloaromatic acids such as 2-fluorobenzoic acid, 3-fluorobenzoic acid, 4-fluorobenzoic acid, 4-trifluoromethylbenzoic acid, phthalic acid, isophthalic acid, terephthalic acid, 4-butoxybenzoic acid, 4-nonyloxybenzoic acid, 4-octylbenzoic acid, 2-(p-toluoyl) benzoic acid, 2-nitrobenzoic acid, 3-nitrobenzoic acid, 4-nitrobenzoic acid, and 4-biphenyl carboxylic acid. Preferred additives from Class 1 are substituted benzoic and salicylic acids. The most preferred additives from Class 1 are benzoic acid, salicylic acid, and o-anisic acid.

Class 1 accelerators can be present in an amount in the range of 0.01 to 10.0 weight percent, preferably 0.1 to 4 weight percent of the total polymerizable composition.

Class 2 is described by the Formula IV:

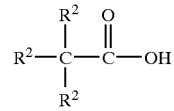

IV

Molecules of Class 2 comprise those compounds having an aliphatic carboxylic moiety wherein each $R^2$ can be the same or different as the other $R^2$s and can be the same materials as those described for $R^1$ in the Class 1 accelerators; additionally, two $R^2$s taken together can form a carbonyl group. Examples of suitable accelerators of this class are formic acid, acetic acid, propionic acid, butyric acid, valeric acid, hexanoic acid, heptanoic acid, octanoic acid, nonanoic acid, decanoic acid, lauric acid, palmitic acid, stearic acid, chloroacetic acid, trifluoroacetic acid, 2-bromovaleric acid, glycolic acid, lactic acid, pyruvic acid, cyclobutanecarboxylic acid, cyclopentanecarboxylic acid, cyclohexanecarboxylic acid, 4-methyl-1-cyclohexanecarboxylic acid, phenylacetic acid, cyclohexylacetic acid, and multi-fuctional carboxylic acids such as oxalic acid, malonic acid, succinic acid, glutaric acid, adipic acid, pimelic acid, suberic acid, azeleic acid, sebacic acid, undecanedioic acid, decanedicarboxylic acid, maleic acid, fumaric acid, trans-1,2-cyclohexanedicarboxylic and hexafluoroglutaric acid. Preferred additives from Class 2 are non-polymeric substituted and unsubstituted aliphatic carboxylic acids. The most preferred compounds from Class 2 are cyclohexanecarboxylic acid and phenylacetic acid. Class 2 accelerators can be present in an amount in the range of 0.01 to 10.0 weight percent, preferably 0.01 to 4 weight percent of the total polymerizable composition.

Class 3 is defined by the formula V:

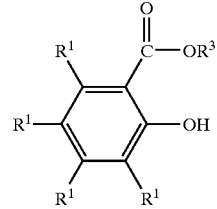

(V)

Molecules of Class 3 comprise esters of salicylic acid wherein each $R^1$, independently, has the same definition as in Formula III and $R^3$ can be selected from $C_1$ to $C_{10}$ substituted or unsubstituted alkyl groups, and groups of one to four substituted or unsubstituted aromatic rings wherein two to four rings can be fused or unfused. Examples of suitable accelerators of this class are methyl salicylate, ethyl salicylate, phenyl salicylate, 2-ethylhexylsalicylate, methyl 4-methoxysalicylate, and methyl 2,6-dihydroxy-4-methylbenzoate. Preferred additives from Class 3 are substituted and unsubstituted esters of salicylic acids. The preferred compound from Class 3 is methyl salicylate. Class 3 accelerators are particularly useful with bis-eta$^6$-arene type organometallic salts and can be present in an amount in the range of 0.01 to 10.0 weight percent, preferably 0.1 to 4 weight percent of the total polymerizable composition.

Class 4 is defined by the formula VI:

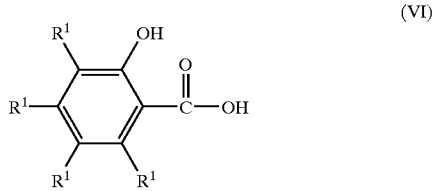

(VI)

Molecules of Class 4 are defined by Formula VI wherein each $R^1$, independently, has the same definition as in Formula III and $R^4$ can be hydrogen or can be the same materials as described for $R^3$ in Formula V. Examples of molecules of Class 4 are salicylaldehyde, o-hydroxyacetophenone, 2-hydroxybenzophenone, 2,4-dihydroxybenzophenone, 2,2',4,4'-tetrahydroxybenzophenone, 2-hydroxy-4-methoxybenzophenone, 5-chloro-2-hydroxybenzophenone, 2-hydroxy-4-octoxybenzophenone, 2-hydroxy-4-methoxy-4'-methylbenzophenone, and 2,2'-dihydroxy-4-methoxybenzophenone. Preferred additives from Class 4 are α-hydroxy aromatic ketones. The preferred compounds from Class 4 are salicyladehyde, o-hydroxyacetophenone, and 2-hydroxybenzophenone. Class 4 accelerators are particularly useful with bis-eta$^6$-arene type organometallic salts and can be present in an amount in the range of 0.01 to 10.0 weight percent, preferably 0.1 to 4 weight percent of the total polymerizable composition.

It should be noted that accelerators of different classes, or even within a class, may not be equally effective with any given initiator.

It is also within the scope of this invention to use one or more accelerating additives selected from different Classes 1 through 4. The different kinds of additives can be present in any proportion up to a total of 10.0 weight percent.

It can also be preferred and within the scope of this invention to add mono- or poly-alcohols as tougheners and flexibilizers to the polymerizable composition. The alcohol or polyol aids in chain extension and preventing over-crosslinking of the epoxide during curing.

Representative mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol, and tetrahydrofurfuryl alcohol.

Preferably, the polyols useful in the present invention have two to five, more preferably two to four, non-phenolic hydroxyl groups. Examples of useful polyols include, but are not limited to, 1,2-ethanediol, 1,2-propanediol, 1,3-propanediol, 1,4-butanediol, 1,3-butanediol, 2-methyl-1,3-propanediol, 2,2-dimethyl-1,3-propanediol, and 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, diethylene glycol, triethylene glycol, tetraethylene glycol, glycerine, 2-ethyl-2-(hydroxymethyl)-1,3-propanediol, 2-ethyl-2-methyl-1,3-propanediol, pentaerythritol, 2-ethyl-1,3-pentanediol, and 2,2-oxydiethanol, sorbitol, 1,4-cyclohexane dimethanol, 1,4-benzene dimethanol, 2-butene-1,4-diol, and polyalkoxylated bis-phenol A derivatives. Other examples of useful polyols are disclosed in U.S. Pat. No. 4,503,211, which is incorporated herein by reference.

Higher molecular weight polyols include the polyethylene and polypropylene oxide polymers in the molecular weight range of 200 to 20,000 such as the CARBOWAX polyethyleneoxide materials supplied by Union Carbide, caprolactone polyols in the molecular weight range of 200 to 5,000, such as the TONE polyol materials supplied by Union Carbide, polytetramethylene ether glycol in the molecular weight range of 200 to 4,000, such as the TERATHANE materials supplied by Dupont (Wilmington, Del.), hydroxyl terminated polybutadiene resins such as the POLY BD supplied by Elf Atochem, hydroxyl terminated polyester materials such as the DYNAPOL copolyester materials from Creanova Inc., Somerset, N.J., or equivalent materials supplied by other manufacturers.

The alcohol functional component can be present as a mixture of materials and can contain mono- and poly-hydroxyl containing materials. The alcohol is preferably present in an amount sufficient to provide an epoxy to hydroxy ratio in the composition between about 1:0.1 and 1:1, more preferably between about 1:0.2 and 1:0.8, and most preferably between about 1:0.2 and 1:0.6.

It is also within the scope of this invention to incorporate thermoplastic oligomeric or polymeric resins to aid in the production of film-based compositions. These thermoplastics can make it easier to form films, i.e., are used as film-formers, and in some cases permit rework of a bond using an appropriate solvent. The thermoplastic resins include those that preferably have glass transition temperatures and/or melting points less than 120° C. Useful thermoplastic resins are essentially free of groups that would interfere with the cationic polymerization of the cationically curable monomers. More particularly, useful thermoplastic resins are essentially free of nucleophilic groups, such as amine, amide, nitrile, sulfur or phosphorus functional groups, and free of metal-complexing groups such as carboxylic acid and sulfonic acid. Furthermore, suitable thermoplastic resins are soluble in solvents such as tetrahydrofuran (THF) or methylethylketone (MEK) and exhibit compatibility with the epoxy resin used.

This compatibility allows the blend of epoxy resin and thermoplastic resin to be solvent cast without phase separating. Nonlimiting examples of thermoplastic resins having these characteristics and useful in this invention include polyesters, co-polyesters, acrylic and methacrylic resins, polysulfones, phenoxy resins such as the PAPHEN materials available from Phenoxy Associates, Rock Hill, S.C., and novolac resins. It is also within the scope of this invention to use a blend of more than one thermoplastic oligomeric or polymeric resin in preparing compositions.

When it is desired to increase the pot-life of compositions of this invention, it can be useful to include a stabilizing additive. Useful pot-life stabilizing additives include Lewis basic, nitrogen-chelate ligands such as 1,10-phenanthroline, 2,2'-dipyridyl, and 2,4,6-tripyridytriazine; trialkyl, triaryl, tricycloalkyl, and trialkaryl amines, phosphines, phosphine oxides, phosphites, arsines, and stibines including triphenylphosphine, triphenylstibine, triphenylarsine, diethyl-o-toluidine, and triphenylphosphite; macrocyclic kryptands and crown ethers such as 12-CROWN-4, 15-CROWN-5, 18-CROWN-6, 21-CROWN-7, KRYPTOFIX 211, and KRYPTOFIX 222, all available from Aldrich Chemical Company, Milwaukee, Wis.; and Schiff base derivatives, which are generally made by the condensation of a ketone or aldehyde with a primary amine. Suitable stabilizing additives are described in U.S. Pat. No. 5,494,943 which is incorporated herein by reference.

A suitable initiation system that includes organometallic complex ionic salts described by Formula I, and at least one accelerator taken from Classes 1 through 4 contains those combinations that, upon application of sufficient energy, generally in the form of heat and/or light, will catalyze the polymerization of the compositions of the invention. The level of catalytic activity depends on various factors such as the choice of ligands and counterions in the organometallic salt and the selection of the type and amount of the at least one accelerator.

Temperature of polymerization and amount of initiator system used will vary depending on the particular polymerizable composition used and the desired application of the polymerized product.

Addition of a silane coupling agent is optional in the preparation of cured compositions of the invention. Preferably the silane coupling agent is added to the polymerizable composition to improve adhesion when at least one substrate surface is glass, an oxide, or any other surface that would benefit from the addition of a silane coupling agent. When present, a silane coupling agent contains a functional group that can react with an epoxy resin, e.g., 3-glycidoxypropyltrimethoxylsilane.

Solvents, preferably organic, can be used to assist in dissolution of the initiator system in the polymerizable monomers, and as a processing aid. It may be advantageous to prepare a concentrated solution of the organometallic complex salt in a small amount of solvent to simplify the preparation of the polymerizable composition. Useful solvents are lactones, such as gamma-butyrolactone, gamma-valerolactone; and epsilon-caprolactone; ketones such as acetone, methyl ethyl ketone, methyl isobutyl ketone, cyclopentanone and cyclohexanone; sulfones, such as tetramethylene sulfone, 3-methylsulfolane, 2,4-dimethylsulfolane, butadiene sulfone, methyl sulfone, ethyl sulfone, propyl sulfone, butyl sulfone, methyl vinyl sulfone, 2-(methylsulfonyl)ethanol, 2,2'-sulfonyldiethanol; sulfoxides, such as dimethyl sulfoxide; cyclic carbonates such as propylene carbonate, ethylene carbonate and vinylene carbonate; carboxylic acid esters such as ethyl acetate, methyl cellosolve acetate, methyl formate; and other solvents such as methylene chloride, nitromethane, acetonitrile, glycol sulfite and 1,2-dimethoxyethane (glyme). In some applications, it may be advantageous to adsorb the initiator onto an inert support such as silica, alumina, clays, as described in U.S. Pat. No. 4,677,137, which is incorporated herein by reference.

Suitable sources of heat to cure the compositions of the invention include induction heating coils, ovens, hot plates, heat guns, infrared sources including lasers, microwave sources. Suitable sources of light and radiation include ultraviolet light sources, visible light sources, and electron beam sources.

Suitable substrates useful to provide articles of the invention include, for example, metals (for example, aluminum, copper, cadmium, zinc, nickel, steel, iron, silver), glass, paper, wood, various thermoplastic films (for example, polyethylene terephthalate, plasticized polyvinyl chloride, polypropylene, polyethylene), thermoset films (for example, polyimide), cloth, ceramics and cellulosics, such as cellulose acetate.

Adjuvants may optionally be added to the compositions such as colorants, abrasive granules, anti-oxidant stabilizers, thermal degradation stabilizers, light stabilizers, conductive particles, tackifiers, flow agents, bodying agents, flatting agents, inert fillers, binders, blowing agents, fungicides, bactericides, surfactants, plasticizers, rubber tougheners and other additives known to those skilled in the art. They also can be substantially unreactive, such as fillers, both inorganic and organic. These adjuvants, if present are added in an amount effective for their intended purpose.

Compositions of this invention are useful to provide abrasion-resistant or protective coatings to articles. The compositions are useful as encapsulants, sealants, molded articles or three-dimensional objects such as those generated by stereolithography. They are also useful as adhesives, including hot melt, pressure sensitive, and structural adhesives, and as binders for abrasives. The compositions may also be useful in imaging applications such as photoresist and photolithography.

In general, a composition's physical properties, i.e., hardness, stiffness, modulus, elongation, strength, etc., is determined by the choice of the epoxy resin, and if an alcohol containing material is used, the ratio of epoxy to alcohol and the nature of the alcohol. Depending on the particular use, each one of these physical properties of the system will have a particular optimum value. Generally, the cured material from a higher epoxy/alcohol ratio is stiffer than from a lower epoxy/alcohol ratio. Generally, for an epoxy/alcohol composition, a shorter chain polyol yields a cured composition that is stiffer than when using a longer chain polyol. The stiffness of a composition can also be increased by using a shorter chain monofunctional alcohol to replace a polyol. Epoxy/alcohol mixtures generally cure faster than epoxy-only compositions. Cycloaliphatic epoxies cure more rapidly than glycidyl ether epoxies. Mixtures of these two types of epoxies can be used adjust the cure rate to a desired level.

To prepare a coated abrasive article using the materials of the subject invention, abrasive particles must be added to the curable composition. The general procedure is to select a suitable substrate such as paper, cloth, polyester, etc., coat this substrate with the "make coat," which consists of the curable composition, applying the abrasive particles, and then curing by the application of a source of energy. A "size coat," which cures to a harder material than the make coat, is then coated over the make coat and cured. The size coat serves to lock the abrasive particles in place. For this and other applications the coating preferably is provided by methods such as bar, knife, reverse roll, extrusion die, knurled roll, or spin coatings, or by spraying, brushing, or laminating.

To prepare a structural/semi-structural adhesive, the curable composition could contain additional adjuvants such as silica fillers, glass bubbles and tougheners. These adjuvants add toughness to, and reduce the density of, the cured composition. Generally shorter chain polyols would be used to give toughness through chain extension of the cured epoxy. A chain diol that is too long generally would produce too soft a cured composition that would not have the strength needed for structural/semi-structural applications. Using polyols having high hydroxyl functionality greater than three could produce an overcrosslinked material resulting in a brittle adhesive.

To prepare magnetic media using the materials of the subject invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare a clear abrasion resistant coating from the materials of the subject invention, two important criteria for selecting the composition are clarity and toughness of the cured composition. Generally, particulate adjuvants would not be added since they would reduce the gloss and clarity of the cured composition. Optionally, pigments or dyes could be added to produce a colored film.

To prepare an electrically conductive adhesive, the curable composition is filled with conductive particles to the level that provides conduction through the adhesive between the desired contact points. One class of conductive adhesives is often referred to as "z-axis adhesives" or as "anisotropically conductive adhesives." This class of adhesive is filled with conductive particles to the level that provides conduction between contact points in the z-axis but not the x-y plane of the adhesive. Such z-axis adhesives are often produced as a thin film adhesive on a carrier substrate, such as a polymer film. A description of materials suitable for z-axis adhesives is disclosed in U.S. Pat. No. 5,362,421, which is incorporated herein by reference.

Molded articles are made by means known to those skilled in the art, as, for example, by reaction injection molding, casting, etc.

Objects and advantages of this invention are further illustrated by the following examples, but they should not be construed as limiting the invention.

EXAMPLES

In the examples, all parts, ratios, and percents are by weight unless specifically indicated otherwise. All materials used are commercially available from Aldrich Chemical Co., Milwaukee, Wis. unless otherwise indicated. All examples were prepared in ambient atmosphere (in the presence of usual amounts of oxygen and water vapor) unless indicated otherwise.

The general sample preparation procedure was as follows: the desired amount of accelerating additive was mixed with the epoxy-containing composition; the resulting mixture was warmed, if necessary, to insure complete dissolution of the components; the mixture was allowed to cool to room temperature (23° C.) before use. Curable mixtures were prepared by measuring out the desired amount of the cationic organometallic catalyst, adding the desired amount of solvent to dissolve the catalyst, then adding the appropriate amount of the epoxy- and accelerator-containing mixture followed by thorough mixing by hand using a wood applicator stick.

Testing
Differential Scanning Calorimetry (DSC)

Differential Scanning Calorimetry (DSC) was performed on a TA Instruments Inc. (New Castle, Del.) 912 DSC, and used to measure the exothermic heat of reaction associated with the thermal cure of the cationically polymerizable monomer. DSC samples were typically 6 to 12 mg. Testing was done in sealed, aluminum, liquid sample pans, at a rate of 10° C./min from room temperature (23° C.) to 300° C. The data from the reaction process was graphed on a chart showing heat flow vs. temperature. The integrated area under an exothermic peak represents the total exotherm energy produced during the reaction and is measured in Joules/gram (J/g); the exotherm energy is proportional to extent of cure, i.e., degree of polymerization. The exotherm profile, i.e., onset temperature (the temperature at which reaction will begin to occur), peak temperature, and end temperature, provides information on conditions needed to cure the material. For any particular reaction, a shift toward lower onset and/or peak temperature for the exotherm indicates that the reactant material is polymerizing at the lower temperatures, which correlates with shorter gel times.

Differential Photo-Calorimetry (DPC)

Differential Photo-calorimetry was used to measure the exothermic heat of reaction associated with the photoinitiated cure of a cationically polymerizable monomer during exposure to light. DPC samples sizes were typically 6 to 12 mg. Testing was done in open aluminum pans, under nitrogen purge, in a TA Instruments Inc. 912 DSC base, equipped with a TA Instruments Inc. 930 differential photocalorimeter (TA Instruments Inc. New Castle, Del.). A 200 watt mercury lamp was used for the photolysis step. In a typical experiment, the sample is held isothermally at the desired temperature throughout the entire DPC experiment. The sample is kept dark for 2 minutes, then a shutter is opened to allow the sample to be irradiated for 5 minutes after which the shutter is closed and the sample is kept dark for an additional 2 minutes. Immediately following the DPC experiment, the samples were capped and heated at 10° C./minute in a DSC experiment as described above. The data from the DPC experiment was graphed on a chart showing the exothermic heat flow vs. time. The area under the exothermic peak represents the total exotherm energy produced during the irradiation, and is measured in Joules/gram (J/g). The exotherm energy is proportional to the extent of cure, and for any particular reaction an increase in the total DPC exotherm energy would indicate a higher degree of cure during the irradiation.

Tensile Test Sample Preparation

Tensile test samples were prepared by using an ASTM D638-98 Type IV die to cut a mold out of 0.79 millimeter (mm) thick silicone rubber material. A sandwich construction was prepared by first laying down on an aluminum panel a 100 micrometer ($\mu$m) polyester sheet coated with a conventional silicone release layer, release side up. The silicone rubber mold was placed on this layer. The polymerizable composition to be cured was applied to the mold. A second piece of release layer coated polyester, release side down, was placed over the mold and a rubber roller was used to smooth out the sample and eliminate air bubbles. The samples were cured with various temperature cycles as stated in the particular example. Using this procedure, reproducible samples were made for tensile tests.

Tensile Testing Procedure

Tensile tests were conducted following the method described in ASTM D638-98 Tensile Testing Methods standard. The samples were tested at a strain rate of 5 mm/min. An Instron Model 1122 tensile tester was used for the tests. Ultimate tensile strength is reported in MPa and is the strength at break, percent elongation is reported in % using the crosshead movement as a measure of elongation, tensile energy absorption is the tensile energy at break point divided by the surface area of the sample and is reported in Newton per millimeters (N/mm), and modulus is reported in MPa and is the modulus at 1% elongation.

Glossary

| Identification Of Components Used In The Examples | |
|---|---|
| ERL4221 | 3,4-epoxycyclohexylmethyl-3,4-epoxy cyclohexanecarboxylate (ERL-4221 available from Union Carbide Corp., Danbury, CT) |
| EPON 828 | Diglycidyl ether of bisphenol A (EPON 828 available from Shell Chemical Co., Houston, TX) |
| CHDM | 1,4-cyclohexanedimethanol |
| CHAA | cyclohexylacetic acid |
| CHCA | cyclohexanecarboxylic acid |
| MMOB | methyl 2-methoxybenzoate |
| o-HAP | 2-hydroxyacetophenone |
| Initiators | |
| (mesitylene)$_2$Fe(SbF$_6$)$_2$ | bis-(eta$^6$-mesitylene)iron(+1) bis-hexafluoroantimonate |
| CpFeXylSbF$_6$ | (eta$^6$-xylenes)(eta$^5$-cyclopentadienyl)-iron(+1) hexafluoroantimonate |
| Cp | Cyclopentadienyl |
| Xyl | Xylenes (mixed isomers) |

Comparative Example C1

To determine the gel time for an epoxy-containing composition that did not contain an accelerating additive, 0.02 g of (mesitylene)$_2$Fe(SbF$_6$)$_2$ was weighed into an aluminum weighing dish (VWR/Scientific Products Inc., West Chester, Pa.), followed by the addition of 0.04 g of propylene carbonate solvent. To aid the dissolution of the initiator in the solvent, the mixture was stirred using a wood applicator stick (Puritan brand, available from Hardwood Products Company, Guilford, Me.). To the resulting catalyst solution was added 2.0 g of an EPON 828/1,6-hexanediol/CHDM mixture (88:6:6 weight % ratio based on the total weight of the mixture (w/w)), hereafter referred to as "monomer mixture." The monomer mixture was prepared by first heating a 50:50 weight ratio mixture of 1,6-hexanediol and CHDM at 60° C., allowing the resulting liquid to cool to room temperature, then adding 12 weight % of this liquid to an appropriate amount of EPON 828. The resulting mixture was heated for 30 minutes at 80° C. then shaken vigorously for 30 seconds to obtain a homogeneous solution that turned milky white upon cooling to room temperature over a 30 minute period. The monomer mixture was then added to the catalyst solution, which was followed by thorough mixing by hand using a wood applicator stick. The resulting formulations were then placed on a hot plate, which was preheated to 125° C., to measure the gel time. The presence of a gel was indicated by solidification of the liquid resin. Gel time or cure time was determined by touching the sample with a stick and noting when the sample was no longer liquid. In this example, gel was formed after 1:27 (min:sec).

Examples 1–3

The effect of adding 1 weight % of a Class 1 accelerating additive to a thermally curable composition was examined. Stock solutions of accelerating additives ("additives") in epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components; after heating the jar was shaken vigorously for 15 seconds and then the mixture was allowed to cool to room temperature (23° C.) before use. This produced a 1% w/w solution of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the thermal polymerization procedure described in Comparative Example C1. The data of Table 1 show that, under the conditions used, the incorporation of a Class 1 type accelerating additive decreased the gel time of the formulation, when compared to the gel time obtained in Comparative Example C1.

TABLE 1

Gel Time Experiments with 1% Accelerating Additive

| Ex. | Additive | Gel Time (min:sec) |
|---|---|---|
| C1 | none | 1:27 |
| 1 | 1% Salicylic Acid | 1:04 |
| 2 | 1% Benzoic Acid | 0:55 |
| 3 | 1% o-Anisic Acid | 0:51 |

Examples 4–6

The effect of adding 2 weight % of a Class 1 accelerating additive to a thermally curable composition was examined. Stock solutions of accelerating additives in epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components; after heating the jar was shaken vigorously and then the mixture was allowed to cool to room temperature (23° C.) before use. This produced a 2% w/w solution of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example C1. The data of Table 2 show that, under the conditions used, the incorporation of a Class 1 type accelerating additive decreased the gel time of the formulation, when compared to the gel time obtained in Comparative Example C1.

TABLE 2

Gel Time Experiments with 2% Accelerating Additive

| Ex. | Additive | Gel Time (min:sec) |
| --- | --- | --- |
| C1 | none | 1:27 |
| 4 | 2% Salicylic Acid | 1:00 |
| 5 | 2% Benzoic Acid | 0:47 |
| 6 | 2% o-Anisic Acid | 0:53 |

Comparative Example C2

To determine the gel time for a photoinitiated epoxy composition that does not contain an accelerating additive, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick. The resulting sample was then placed under a 500 Watt tungsten-halogen lamp with the glass cover of the housing removed. The sample was positioned 21 cm away from the light source, and irradiated continuously until gellation was observed. The presence of a gel was indicated by solidification of the liquid resin. In this Comparative Example, gel was formed after 3:30 (min:sec).

Examples 7–9

The gel time for a photoinitiated epoxy composition containing a Class 1 accelerating additive was examined. Stock solutions of different Class 1 accelerator additives in epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components; after heating the jar was shaken vigorously for 15 seconds and then the mixture was allowed to cool to room temperature (23° C.) before use. This produced a 1% w/w solution of the additive in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the photopolymerization procedure described in Comparative Example C2, with the results shown in Table 3. The data of Table 3 show that the incorporation of Class 1 type accelerating additives into an epoxy-containing formulation decreases the gel time, when compared to the gel time obtained in Comparative Example C2.

TABLE 3

Gel Time Experiments with 1% Accelerating Additive

| Ex. | Additive | Gel Time (min:sec) |
| --- | --- | --- |
| C2 | none | 3:30 |
| 7 | 1% Salicylic Acid | 1:16 |
| 8 | 1% Benzoic Acid | 1:26 |
| 9 | 1% o-Anisic Acid | 1:19 |

Examples 10–12

The gel time for a photoinitiated epoxy composition containing a Class 1 accelerating additive was examined. Stock solutions of different Class 1 accelerator additives in epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components; after heating the jar was shaken vigorously for 15 seconds and then the mixture was allowed to cool to room temperature (23° C.) before use. This produced a 2% w/w solution of the additive in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the photopolymerization procedure described in Comparative Example C2, with the results shown in Table 4. The data of Table 4 show that the incorporation of 2 weight percent of a Class 1 type accelerating additive into an epoxy-containing formulation decreases the gel time, when compared to the gel time obtained in Comparative Example C2. Additionally, when compared to Examples 7–9, the data in Table 4 show that incorporation of 2% accelerating additive provided faster gel times than formulations containing 1% accelerating additive.

TABLE 4

Gel Time Experiments with 2% Accelerating Additive

| Ex. | Additive | Gel Time (min:sec) |
| --- | --- | --- |
| C2 | none | 3:30 |
| 10 | 2% Salicylic Acid | 1:12 |
| 11 | 2% Benzoic Acid | 1:11 |
| 12 | 2% o-Anisic Acid | 1:13 |

Examples 13–15 and Comparative Example C3

The effect of adding various Class 1 accelerating additives to a photoinitiated composition was examined. For these examples, the photoinitiated polymerization of an epoxy composition, with and without an accelerating additive, was investigated using differential photocalorimetry (DPC) followed by differential scanning calorimetry (DSC). Stock solutions having 1% additive in epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven, pre-heated to 80° C., for approximately 30 minutes to insure maximum dissolution of the accelerator; after heating, the jar was shaken vigorously for 15 seconds and the mixture was allowed to cool to room temperature (23° C.) before use. This produced a 1% w/w solution of the additive in the epoxy.

For each example, 0.02 g of $CpFeXylSbF_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the desired stock solution, followed by thorough mixing, by hand, using a wood applicator stick.

For the comparative example C3, 0.02 g of $CpFeXylSbF_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick.

The resulting solutions for the examples and the comparative example were subjected to light then heat in accordance with the DPC and DSC test methods described herein, with the results shown in Table 5. The DPC tests were run at 30° C. Essentially no exotherm was observed for either the examples or the comparative examples in the DPC; however, the effect of the accelerating additive can be seen from the subsequent DSC tests. The data in Table 5 show that the exotherm peak temperature shifts to lower temperatures upon addition of 1% of the Class 1 additive. The DSC exotherm energy was determined by integrating the energy under the curve between 55° C. and 225° C. The amount of integrated exotherm energy both above and below the Comparative Example C3 peak maximum temperature (117° C.) was then calculated. The larger the area of total DSC exotherm energy below the comparative example peak temperature, the higher the degree of cure. It can be seen from Table 5 that significantly higher degrees of cure were obtained upon addition of 1% of a Class 1 additive, relative to the control where no additive was present.

TABLE 5

DPC/DSC Experiments with 1% Various Additives

| Example | Additive | Exotherm Peak Temp. (° C.) | Total DSC Exotherm Energy (J/g) | Percent DSC Energy below 117° C. (J/g) |
|---|---|---|---|---|
| C3 | None | 117 | 416 | 44 |
| 13 | 1% Salicylic Acid | 109 | 390 | 67 |
| 14 | 1% Benzoic Acid | 98 | 520 | 71 |
| 15 | 1% o-Anisic Acid | 108 | 431 | 59 |

Examples 16–18

The effect of adding various Class 1 accelerating additives to a photoinitiated composition was examined. For these examples, the photoinitiated polymerization of an epoxy composition, with and without an accelerating additive, was investigated using differential photocalorimetry (DPC) followed by differential scanning calorimetry (DSC). Stock solutions having 2% additive in epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven, pre-heated to 80° C., for approximately 30 minutes to insure maximum dissolution of the accelerator; after heating, the jar was shaken vigorously for 15 seconds and the mixture was allowed to cool to room temperature (23° C.) before use. This produced a 2% w/w solution of the additive in the epoxy.

For each example, 0.02 g of $CpFeXylSbF_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the desired stock solution, followed by thorough mixing, by hand, using a wood applicator stick. The resulting solutions for the examples were subjected to light then heat in accordance with the DPC and DSC test methods described herein, with the results shown in Table 6. The DPC tests were run at 30° C. Essentially no exotherm was observed for the examples in the DPC; however, the effect of the accelerating additive can be seen from the subsequent DSC tests. When compared to the data in Table 5, the data in Table 6 show that the exotherm peak temperature shifts to even lower temperatures when 2% of the Class 1 additive was incorporated into the epoxy formulation. The DSC exotherm energy was determined by integrating the energy under the curve between 55° C. and 225° C. The amount of integrated exotherm energy both above and below the Comparative Example C3 peak maximum temperature (117° C.) was then calculated. The larger the area of total DSC exotherm energy below the comparative example peak temperature, the higher the degree of cure. It can be seen from Table 6 that significantly higher degrees of cure were obtained upon addition of 2% of a Class 1 additive, relative to the control, C3, where no additive was present.

TABLE 6

DPC/DSC Experiments with 2% Various Additives

| Example | Additive | Exotherm Peak Temp. (° C.) | Total DSC Exotherm Energy (J/g) | Percent DSC Energy below 117° C. (J/g) |
|---|---|---|---|---|
| C3 | None | 117 | 416 | 44 |
| 16 | 2% Salicylic Acid | 102 | 363 | 79 |
| 17 | 2% Benzoic Acid | 90 | 497 | 79 |
| 18 | 2% o-Anisic Acid | 96 | 419 | 72 |

Examples 19–22 and Comparative Example C4

The effect of adding a Class 1 accelerating additive to a thermally curable composition was examined by DSC. Stock solutions of accelerator/epoxy mixtures were prepared having 0.25%, 0.5%, 1%, and 2% o-anisic acid by adding 0.025 g, 0.05 g, 0.1 g, 0.2 g, respectively, of o-anisic acid to separate vials containing 10 g of an EPON 828/1,6-hexanediol/CHDM (88:6:6 w/w) mixture (prepared in the same manner as described in Comparative Example C1), and mixing thoroughly, by hand, using a wood applicator.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

For the comparative example, C4, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick.

The samples were analyzed by DSC as described in the testing section with the samples being integrated between 50° C. to 225° C. The results in Table 7 show that small amounts of the Class 1 accelerating additive significantly reduce the peak exotherm temperature when compared to comparative example, C4, where no additive was incorporated. Additionally, increasing the additive concentration resulted in continued lowering of the peak exotherm temperature.

TABLE 7

Effect of Accelerating Additive Concentration on Gel Time

| Ex. | o-Anisic Acid (%) | Peak Temperature (° C.) | Total Exotherm Energy (J/g) | % Exotherm Energy below 110° C. |
|---|---|---|---|---|
| C4 | None | 112.3 | 413 | 32 |
| 19 | 0.25 | 99.2 | 433 | 80 |
| 20 | 0.5 | 98.3 | 414 | 77 |
| 21 | 1 | 94.3 | 430 | 76 |
| 22 | 2 | 93.9 | 419 | 83 |

Examples 23–25 and Comparative Example C5

The effect on physical properties of adding a Class 1 accelerating additive to a thermally curable composition was examined. Stock solutions of accelerator/epoxy mixtures were prepared having 0.5%, 1%, and 2% benzoic acid by adding 0.4 g, 0.8 g, and 1.6 g, respectively, of benzoic acid to separate vials containing 80 g of an EPON 828/1,6-hexanediol/CHDM (88:6:6 w/w) mixture (prepared in the same manner as described in Comparative Example C1), and mixing thoroughly, by hand, using a wood applicator. For each example, 0.2 g of (mesitylene)$_2$Fe(SbF$_6$)$_2$ was weighed into a glass jar, followed by the addition of 0.4 g of propylene carbonate solvent. To aid the dissolution of the initiator in the solvent, the mixture was stirred using a wood applicator stick. To the resulting catalyst solution was added 40 g of the appropriate stock solution followed by thorough mixing, by hand, using a wood applicator stick.

For the comparative example, C5, 0.2 g of (mesitylene)$_2$Fe(SbF$_6$)$_2$ was weighed into an aluminum dish, followed by the addition of 0.4 g of propylene carbonate solvent. To aid the dissolution of the initiator in the solvent, the mixture was stirred using a wood applicator stick. To the resulting catalyst solution was added 40 g of an EPON 828/1,6-hexanediol/CHDM (88:6:6 w/w) mixture (prepared in the same manner as described in Comparative Example C1), followed by thorough mixing, by hand, using a wood applicator stick.

The tensile test samples were prepared as described in the testing section. The samples were cured by heating from room temperature (23° C.) to 120° C. over 40 minutes, followed by holding at 120° C. for 3 hours. Tensile tests were performed as described in the testing section. The results of the tensile tests are shown in Table 8. As can be seen from the results in Table 8, in all cases, the presence of the Class 1 additive benzoic acid gave materials having increased modulus, percent strain at break, and tensile energy absorption. Additionally, Examples 23-25 show that increasing the level of benzoic acid actually yielded tougher cured materials as evidenced by the increase in the tensile energy absorption.

TABLE 8

Tensile Test Experiments

| Example | Weight % benzoic acid | Stress at Break (MPa) | Elongation at Break in % | Young's Modulus (MPa) | Tensile Energy at Break (N/mm) |
|---|---|---|---|---|---|
| C5 | None | 51.0 | 10.0 | 693 | 3.26 |
| 23 | 0.5 | 61.9 | 11.1 | 766 | 4.32 |
| 24 | 1 | 60.8 | 12.3 | 705 | 4.89 |
| 25 | 2 | 63.6 | 12.1 | 782 | 4.98 |

Examples 26–29

The effect of adding 1 weight % of a Class 2 accelerating additive to a thermally curable composition was examined. Stock solutions of accelerating additives ("additives") in epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components; after heating the jar was shaken vigorously for 15 seconds and then the mixture was allowed to cool to room temperature (23° C.) before use. This produced a 1% w/w solution of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example C1. The data of Table 9 show that, under the conditions used, the incorporation of a Class 2 type accelerating additive decreased the gel time of the formulation, when compared to the gel time obtained in Comparative Example C1.

TABLE 9

Gel Time Experiments with 1% Accelerating Additive

| Ex. | Additive | Gel Time (min:sec) |
|---|---|---|
| C1 | None | 1:27 |
| 26 | 1% CHCA | 1:02 |

TABLE 9-continued

Gel Time Experiments with 1% Accelerating Additive

| Ex. | Additive | Gel Time (min:sec) |
|---|---|---|
| 27 | 1% CHAA | 1:16 |
| 28 | 1% Phenylacetic acid | 1:06 |
| 29 | 1% 2-ketobutyric acid | 1:07 |

Examples 30–33

The effect of adding 2 weight % of a Class 2 accelerating additive to a thermally curable composition was examined. Stock solutions of accelerating additives ("additives") in epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced a 1% w/w solution of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example C1. The data of Table 10 show that, under the conditions used, the incorporation of a Class 2 type accelerating additive decreased the gel time of the formulation, when compared to the gel time obtained in Comparative Example C1.

TABLE 10

Gel Time Experiments with 2% Accelerating Additive

| Ex. | Additive | Gel Time (min:sec) |
|---|---|---|
| C1 | None | 1:27 |
| 30 | 2% CHCA | 1:00 |
| 31 | 2% CHAA | 1:04 |
| 32 | 2% Phenylacetic acid | 1:01 |
| 33 | 2% 2-ketobutyric acid | 1:03 |

Examples 34–37

The gel time for a photoinitiated epoxy composition containing a Class 2 accelerating additive was examined. Stock solutions of different Class 2 accelerator additives and epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components. After heating the jar was shaken vigorously for 15 seconds and then the mixture was allowed to cool to room temperature (23° C.) before use. This produced a 1% w/w solution of the additive in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the procedure described in Comparative Example C2, with the results shown in Table 11. The data of Table 11 show that the incorporation of Class 2 type accelerating additives into an epoxy-containing formulation decreases the gel time, when compared to the gel time obtained in Comparative Example C2.

TABLE 11

Gel Time Experiments with 1% Accelerating Additive

| Ex. | Additive | Gel Time (min:sec) |
|---|---|---|
| C2 | None | 3:30 |
| 34 | 1% CHCA | 1:44 |
| 35 | 1% CHAA | 1:44 |
| 36 | 1% Phenylacetic acid | 1:34 |
| 37 | 1% 2-ketobutyric acid | 0:48 |

Examples 38–41

The gel time for a photoinitiated epoxy composition containing a Class 2 accelerating additive was examined. Stock solutions of different Class 2 accelerator additives and epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components. After heating the jar was shaken vigorously for 15 seconds and then the mixture was allowed to cool to room temperature (23° C.) before use. This produced a 2% w/w solution of the additive in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the procedure described in Comparative Example C2, with the results shown in Table 12. The data of Table 12 show that the incorporation of 2 weight percent of a Class 2 type accelerating additive into an epoxy-containing formulation decreases the gel time, when compared to the gel time obtained in Comparative Example C2.

TABLE 12

Gel Time Experiments with 2% Accelerating Additive

| Ex. | Additive | Gel Time (min:sec) |
|---|---|---|
| C2 | None | 3:30 |
| 38 | 2% CHCA | 1:31 |
| 39 | 2% CHAA | 1:28 |
| 40 | 2% Phenylacetic acid | 1:39 |
| 41 | 2% 2-ketobutyric acid | 0:44 |

Examples 42–43 and Comparative Example C6

The effect of adding a Class 3 accelerating additive to a thermally curable composition was examined. Stock solutions of 1% and 2% of methyl salicylate in epoxy resin were prepared by combining, in a glass jar, 0.1 g and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

For the comparative example, C6, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick.

The samples were analyzed by DSC experiments as described in the testing section, and integrated from 50° C. to 225° C. The data of Table 13 show that, under the conditions used, the incorporation of a Class 3 type accelerating additive gives a cure having a lower peak exotherm temperature and higher percent conversion at 100° C., when compared to the data of Comparative Example C6 where no additive was present.

TABLE 13

DSC Experiments with Class 3 Accelerating Additive

| Ex. | Additive | Peak Temperature (° C.) | Total Exotherm Energy (J/g) | % Exotherm Energy below 100° C. |
|---|---|---|---|---|
| C6 | None | 112.3 | 413 | 6.7 |
| 42 | 1% Methyl salicylate | 108.4 | 421 | 11.5 |
| 43 | 2% Methyl salicylate | 107.8 | 425 | 15.4 |

Examples 44–45

The effect of adding a Class 4 accelerating additive to a thermally curable composition was examined. Stock solutions of 1% and 2% of o-hydroxyacetophenone in epoxy resin were prepared by combining, in a glass jar, 0.1 g and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

The samples were analyzed by DSC experiments as described in the testing section, and integrated from 50° C. to 225° C. The data of Table 14 show that, under the conditions used, the incorporation of a Class 4 type accelerating additive gives a cure having a lower peak exotherm temperature and higher percent conversion at 100° C., when compared to the data of Comparative Example C6 where no additive was present.

TABLE 14

DSC Experiments with Class 4 Accelerating Additive

| Ex. | Additive | Peak Temperature (° C.) | Total Exotherm Energy (J/g) | % Exotherm Energy below 100° C. |
|---|---|---|---|---|
| C6 | None | 112.3 | 413 | 6.7 |
| 44 | 1% o-hydroxy acetophenone | 105 | 404 | 23.1 |
| 45 | 2% o-hydroxy acetophenone | 107 | 403 | 19.1 |

Examples 46–47

The effect on gel times by adding various levels of a Class 4 accelerating additive to a thermally curable composition was examined. Stock solutions of 1% and 2% of o-hydroxyacetophenone in epoxy resin were prepared by combining, in a glass jar, 0.1 g and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example C1. The data of Table 15 show that, under the conditions used, the incorporation of a Class 4 type accelerating additive decreased the gel time of the formulation, when compared to the gel time obtained in Comparative Example C1 where no additive was used.

TABLE 15

Gel Time Experiments with Class 4 Accelerating Additive

| Ex. | Additive | Gel Time (min:sec) |
|---|---|---|
| C1 | None | 1:27 |
| 46 | 1% o-hydroxy acetophenone | 1:23 |
| 47 | 2% o-hydroxy acetophenone | 1:12 |

Examples 48–49

The gel time for a photoinitiated epoxy composition containing a Class 4 accelerating additive was examined. Stock solutions of 1% and 2% of a Class 4 additive in epoxy resin were prepared by combining, in a glass jar, 0.1 g and 0.2 g, respectively, of o-hydroxyacetophenone with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of o-hydroxyacetophenone in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the procedure described in Comparative Example C2, with the results shown in Table 16. The data of Table 16 show that this particular Class 4 additive was not an effective accelerator for cationic poly merization catalyzed by the CpFeXylSbF$_6$ salt, when compared to the gel time obtained in Comparative Example C2.

TABLE 16

Gel Time Experiments with a Class 4 additive

| Ex. | Additive | Gel Time (min:sec) |
|---|---|---|
| C2 | None | 3:30 |
| 48 | 1% o-hydroxy acetophenone | >5:00 |
| 49 | 2% o-hydroxy acetophenone | >5:00 |

Comparative Examples C7–C10

The effect on the thermal stability of epoxy-containing compositions having no catalyst was investigated. Various levels of Class 1 additives were added to epoxy-containing compositions that did not contain a catalyst useful for the present invention, and analyzed by DSC. Stock solutions of 1% and 2% of a Class 1 additive in epoxy resin were prepared by combining, in a glass jar, 0.1 g and 0.2 g, respectively, of the additive with 10 g of an EPON 828/1, 6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of the additive in the epoxy. The samples were analyzed by DSC experiments as described in the testing section. When compared to the data of Comparative Example C4, the data in Table 17 show that the Class 1 additives do not react with epoxy-containing compositions at temperatures observed when a catalyst is not incorporated. Additionally, at the levels typically used for additives of the present invention, the data for the Comparative Examples of Table 17 show that even at high temperatures the total exotherm energy is only a small fraction of the total exotherm observed when a catalyst useful for the invention is not incorporated.

TABLE 17

DSC Experiments: Class 1 Additives with Epoxy-Containing Formulation

| Ex. | Additive | Peak Temperature (° C.) | Total Exotherm Energy (J/g) |
|---|---|---|---|
| C4 | None | 112.3 | 413 |
| C7 | 1% benzoic acid | 242 | 22.4 |
| C8 | 2% benzoic acid | 182 | 17.34 |
| C9 | 1% salicylic acid | 234 | 39.0 |
| C10 | 2% salicylic acid | 201 | 60.1 |

Comparative Examples C11–C14

The effect on gel times by adding various levels of methyl 2-methoxybenzoate to an epoxy-containing composition was examined. Stock solutions of 1% and 2% of methyl 2-methoxybenzoate in epoxy resin were prepared by combining, in a glass jar, 0.1 g and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of methyl 2-methoxybenzoate in the epoxy.

For Comparative Examples C11-C12, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

For Comparative Examples C13-C14, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times for C11 and C12 were determined following the procedure described in Comparative Example C1, while gel times for C13 and C14 were determined following the procedure described in Comparative Example C2 with the results shown in Table 18. When compared to the Comparative Examples C1 and C2, the data of Table 18 show that methyl 2-methoxybenzoate is not a useful accelerating additive for the cationic polymerizations described in this invention.

TABLE 18

Gel Time Experiments with a Class 4 additive

| Ex. | Catalyst | Additive | Gel Time (min:sec) |
|---|---|---|---|
| C1 | (mesitylene)$_2$Fe(SbF$_6$)$_2$ | None | 1:27 |
| C11 | (mesitylene)$_2$Fe(SbF$_6$)$_2$ | 1% MMOB | 2:43 |
| C12 | (mesitylene)$_2$Fe(SbF$_6$)$_2$ | 2% MMOB | 2:25 |
| C2 | CpFeXylSbF$_6$ | None | 3:30 |
| C13 | CpFeXylSbF$_6$ | 1% MMOB | 3:42 |
| C14 | CpFeXylSbF$_6$ | 2% MMOB | 3:37 |

Examples 50–51

The effect on gel times by adding various levels of a Class 3 accelerating additive to a thermally curable composition was examined. Stock solutions containing 1% and 2% methyl salicylate in epoxy resin were prepared by combining, in a glass jar, 0.1 g and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of the additive in the epoxy.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example C1, with the results shown in Table 19. The data of Table 19 show that, under the conditions used, the incorporation of a Class 3 type accelerating additive decreased the gel time of the formulation, when compared to the gel time obtained in Comparative Example C1 where no additive was used.

TABLE 19

Gel Time Experiments with Class 3 Accelerating Additive

| Ex. | Additive | Gel Time (min:sec) |
|---|---|---|
| C1 | None | 1:27 |
| 50 | 1% methyl salicylate | 1:25 |
| 51 | 2% methyl salicylate | 1:04 |

Examples 52–53

The gel time for a photoinitiated epoxy composition containing a Class 3 accelerating additive was examined. Stock solutions of 1% and 2% of a Class 3 additive in epoxy resin were prepared by combining, in a glass jar, 0.1 g and 0.2 g, respectively, of methyl salicylate with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), that had been pre-heated to 80° C., for approximately 30 minutes to insure complete dissolution of the components. After heating the jar was shaken vigorously for 15 seconds and then the mixture was allowed to cool to room temperature (23° C.) before use. This produced 1% and 2% w/w solutions of methyl salicylate in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the procedure described in Comparative Example C2, with the results shown in Table 20. The data of Table 20 show that this particular Class 3 additive was not an effective accelerator for cationic polymerization catalyzed by the CpFeXylSbF$_6$ salt, when compared to the gel time obtained in Comparative Example C2 where no additive was used.

TABLE 20

Gel Time Experiments with a Class 3 additive

| Ex. | Additive | Gel Time (min:sec) |
|---|---|---|
| C2 | None | 3:30 |
| 52 | 1% methyl salicylate | 4:49 |
| 53 | 2% methyl salicylate | 4:40 |

We claim:

1. A cured composition comprising the reaction product of an energy polymerizable composition comprising a) at least one cationically curable material, b) a two-component initiator system comprising
   (1) at least one ink of an organometallic complex cation, wherein said cation contains at least one carbon atom bonded to a transition metal atom, and
   (2) one or more accelerators selected from the group consisting of classes 1, 2, and 3 wherein class 1 compounds are represented by Formula III:

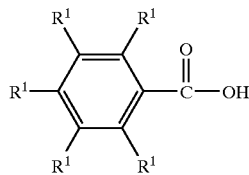

(III)

wherein each $R^1$ in Formula III, independently, is hydrogen, chloro, iodo, bromo, hydroxy, fluoro, cyano, nitro, nitroso, formyl, acetyl, benzoyl, trialkylsilyl, and trialkoxysilyl, unsubstituted alkyl, alkenyl, alkynyl, and alkoxy groups containing up to 30 carbon atoms, one to four substituted or unsubstituted aromatic rings wherein two to four rings are fused or unfused, or two $R^1$s taken together form at least one ring which is saturated or unsaturated and the ring is substituted or unsubsituted, the compound of formula III having no more than group bonded to the benzene ring;

class 2 compounds are represented by Formula IV:

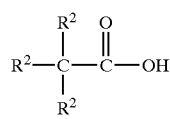

IV wherein each $R^2$ is the same or different us the other $R^2$s and is an unsubstituted alkyl; or two $R^2$s taken together form a saturated ring that is substituted or unsubstituted; or two $R^2$s are replaced with a double bonded oxygen to form a carbonyl group; and class 3 compounds are represented by Formula V:

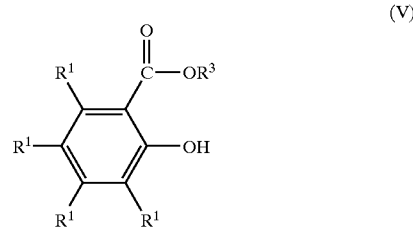

(V)

wherein each $R^1$ in Formula V, independently, is hydrogen, chloro, iodo, bromo, fluoro, cyano, nitro, nitroso, formyl, acetyl, benzoyl, trialkylsilyl, and trialkoxysilyl, unsubstitued alkyl, alkenyl, alkynyl, and alkoxy groups containing up to 30 carbon atoms, one to four substituted or unsubstitued aromatic rings wherein two to four rings are fused or unfused, or two $R^1$s taken together form at least one ring which is saturated or unsaturated and the ring is substituted or unsubstituted; and $R^3$ is selected from $C_1$ to $C_{10}$ substituted or unsubstituted alkyl groups, or groups of one to four substituted or unsubstituted aromatic rings wherein two to four rings are fused or unfused.

2. An article comprising the cured composition of claim 1 wherein said cured composition is a sealant.

3. An article comprising the cured composition of claim 1 wherein said cured composition further comprises an abrasive.

4. The cured composition of claim 1 wherein said salt of an organametallic complex cation has the formula $$[(L^1)_y(L^2)_zM]^{+9} X_n \qquad (I)$$

wherein

M is selected from the group consisting essentially of Cr, Ni, Mo, W, Mn, Tc, Re, Fe, Ru, Os, Co, Rh and Ir;

$L^1$ represents none, one or two of the same or different ligands contributing pi-electrons that can be selected from aromatic ligands and heterocyclic aromatic ligands, and the ligand is capable of contributing six pi-electrons to the valence shell of M;

$L^2$ represents none, one or two of the same or different ligands contributing pi-electrons that can be selected from cyclopentadienyl and indenyl anion groups, and the ligand is capable of contributing six pi-electrons to the valence shell of M;

q is an integer having a value of 1 or 2, the residual charge of the complex cation;

y and z are integers having a value of zero, one, or two, provided that the sum of y and z is equal to 2;

X is an anion selected from consisting essentially of tris-(highly fluorinated alkyl)sulfonyl methide, bis-(highly fluorinated alkyl)sulfonyl imide, tris-(fluorinated aryl)sulfonyl methide, tetrakis-(fluorinated aryl) borate; organic sulfonate anions, and halogen-containing complex anions of a metal or metalloid; and n is an integer having a value of 1 or 2, the number of complex anions required to neutralize the charge q on the complex cation.

5. The cured composition of claim 1 wherein said accelerator is selected from Class 1.

6. The cured composition of claim 5 wherein the salt is a bis-eta[6]-arene organometallic salt.

7. The cured composition of claim 5 wherein the salt is a cyclopentadienyl iron arene organometallic salt.

8. The cured composition of matter of claim 1 wherein the class 1 compound is benzoic acid, salicylic acid, o-anisic acid, 2-ethoxybenzoic acid, o-toluic acid, m-toluic acid, p-toluic acid, 2-fluorobenzoic acid, 3-fluorobenzoic acid, 4-fluorobenzoic acid, 4-trifluoromethylbenzoic acid, phthalic acid, isophthalic acid, terephthialic acid, 4-butoxybenzoic acid, 4-nonyloxybenzoic acid, 4-octylbenzoic acid, 2-(p-toluoyl)benzoic acid, 2-nitrobenloic acid, 3-nitrobenzoic acid, 4-nitrobenzoic acid, 4-biphenyl carboxylic acid, or a combination thereof.

9. The cured composition of claim 1 wherein the class 1 compound is benzoic acid, salicylic acid, or o-anisic acid.

10. The cured composition of claim 1 wherein said accelerator is selected from Class 2.

11. The cured composition of claim 10 wherein the salt is a bis-eta$^6$-arene organometallic salt.

12. The cured composition of claim 10 wherein the salt is a cyclopentadienyl iron arene organometallic salt.

13. The cured composition of claim 1 wherein the class 2 compound is a nonpolymeric substituted or unsubstituted aliphatic carboxylic acid.

14. The cured composition of claim 1 wherein the class 2 compound is cyclohexanecarboxylic acid or phenylacetic acid.

15. The cured composition of claim 1 wherein said accelerator is selected from class 3.

16. The cured composition of claim 15 wherein the salt is bis-eta$^6$-arene organometallic salt.

17. The cured composition of claim 15 wherein the salt is a cyclopentadienyl iron arene organometanic salt.

18. The cured composition of claim 1 wherein the class compound is a substituted or unsubsituted esters of salicylic acid.

19. The cured composition of claim 1 wherein the class 3 compound is methyl salicylate.

20. An article comprising a substrate having on at least one surface thereof a layer or cured composition comprising the reaction product of an energy polymerizuble composition comprising:
a) at least one cationically curable material,
b) a two-component initiator system comprising
(1) at least one salt of an organometallic complex cation, wherein said cation contains at least one carbon atom bonded to a transition metal atom, and
(2) one or more accelerators selected from the group consisting of classes 1, 2 and 3 wherein
class 1 compounds are represented by Formula III:

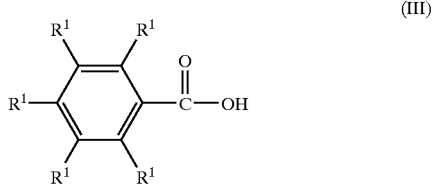
(III)

wherein each R$^1$ in Formula III, independently is hydrogen, chioro, iodo, bromo, hydroxy, fluoro, cyano, nitro, nitroso, formyl, acetyl, benzoyl, trialkylsilyl, and trialkoxysilyl, unsubstiruted alkyl, alkenyl, alkyriyl, and alkoxy groups containing up to 30 carbon atoms, one to tour substituted or unsubstituted aromatic rings wherein two to four rings are fused or unfused, or two R$^1$s taken together form at least one ring which is saturated or unsaturated and the ring is substitutod or unsubstituted, the compound or Formula III having no more then one hydroxy group bonded to the benzene ring;

class 2 compounds are represented by Formula IV:

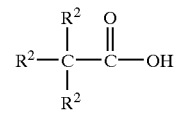
(IV)

wherein each R$^2$ is the same or different as the other R$^2$ and is an unsubstituted alkyl, or two R$^2$s taken together form a saturated that is substitutod or unsubstituted; or two R$^2$s are replaced with a double bonded oxygen to form a carbonyl group; and class 3 compounds are represented by Formula V:

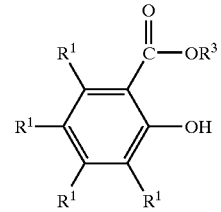
(V)

wherein each R$^1$ in Formula V, independently is hydrogen, chioro, iodo, bromo, hydroxy, fluoro, cyano, nitro, nitroso, formyl, acetyl, benzoyl, trialkylsilyl, and trialkoxysilyl, unsubstiruted alkyl, alkenyl, alkyriyl, and alkoxy groups containing up to 30 carbon atoms, one to tour substituted or unsubstituted aromatic rings wherein two to four rings are fused or unfused, or two R$^1$s taken together form at least one ring which is saturated or unsaturated and the ring is substitutod or unsubstituted; and R$^3$ is selected from C$_1$ to $_{10}$ substituted or unsubstituted alkyl groups, or groups of one to four substituted or unsubstituted aromatic rings wherein two to four rings are fused or unfused.

21. The article of claim 20, said energy polymerizable composition further comprising a thermoplastic resin.

22. The article of claim 20, wherein said layer is an adhesive.

23. The article of claim 22, wherein said layer is electrically conductive.

* * * * *

UNITED STATES PATENT AND TRADEMARK OFFICE
CERTIFICATE OF CORRECTION

PATENT NO. : 6,906,156 B2
APPLICATION NO. : 10/653669
DATED : June 14, 2005
INVENTOR(S) : Wayne S. Mahoney It is certified that error appears in the above-identified patent and that said Letters Patent is hereby corrected as shown below:

First Page
Column 1 (Title), Line 3, delete "CATALYST" and insert -- CATALYSTS --, therefor.

Column 2 (Other Publications), Line 11, delete "TY.S" and insert -- Y.S --, therefor.
Line 16, delete "BAsic" and insert -- Basic --, therefor.

Column 1
Line 4, delete "CATALYST" and insert -- CATALYSTS --, therefor.

Column 7
Line 41, delete "$CF_3SO_3$" and insert -- $CF_3SO_3^-$ --, therefor.

Column 33
Line 24, in Claim 1, delete "ink" and insert -- salt --, therefor.
Line 52, in Claim 1, after "than" insert -- one hydroxyl --.
Line 63, in Claim 1, delete "us" and insert -- as --, therefor.

Column 34
Line 32, in Claim 4, delete "organametallic" and insert -- organometallic --, therefor.

Line 34, in Claim 4, delete " $[(L^1)_y(L^2)_xM]^{+q} X_n$ " and insert -- $[(L^1)_y(L^2)_zM]^{+q} X_n$ --, therefor.

Column 35
Line 6, In Claim 8, delete "terephthialic" and insert -- terephthalic --, therefor.

Column 35
Line 9, in Claim 8, delete "2-nitrobenloic" and insert -- 2-nitrobenzoic --, therefor.
Line 30, in Claim 17, delete "organometanic" and insert -- organometallic --, therefor.
Line 37, in Claim 20, delete "or" and insert -- of --, therefor.
Line 38, in Claim 20, delete "polymerizuble" and insert -- polymerizable --, therefor.
Line 47, in Claim 20, after "2" insert -- , --.

UNITED STATES PATENT AND TRADEMARK OFFICE
CERTIFICATE OF CORRECTION

PATENT NO. : 6,906,156 B2
APPLICATION NO. : 10/653669
DATED : June 14, 2005
INVENTOR(S) : Wayne S. Mahoney It is certified that error appears in the above-identified patent and that said Letters Patent is hereby corrected as shown below:

<u>Column 36</u>
Line 1, in Claim 20, after "independently" insert -- , --.
Line 2, in Claim 20, delete "chioro" and insert -- chloro --, therefor.
Line 4, in Claim 20, delete "unsubstiruted" and insert -- unsubstituted --, therefor.
Line 4, in Claim 20, delete "alkyriyl" and insert -- alkynyl --, therefor.
Line 5, in Claim 20, delete "tour" and insert -- four --, therefor.
Line 9, In Claim 20, delete "substitutod" and insert -- substituted --, therefor.
Line 10, in Claim 20, delete "then" and insert -- than -- therefor.
Line 20, in Claim 20, after "other" delete "$R^2$" andinsert -- $R^2$s --, therefor.
Line 22, in Claim 20, delete "substitutod" and insert -- substituted --, therefor.
Line 38, in Claim 20, after "independently" insert -- , --.
Line 39, in Claim 20, delete "chioro" and insert -- chloro --, therefor.
Line 39, in Claim 20, after "bromo," delete "hydroxy,".
Line 41, in Claim 20, delete "unsubstiruted" and insert -- substituted --, therefor.
Line 41, In Claim 20, delete "alkyriyl" and insert -- alkynyl --, therefor.

Signed and Sealed this

Seventeenth Day of October, 2006

JON W. DUDAS
*Director of the United States Patent and Trademark Office*